United States Patent [19]
Matsumoto

[11] Patent Number: 4,984,623
[45] Date of Patent: Jan. 15, 1991

[54] ELECTRODE WATER CIRCULATION AND PROCESSING SYSTEM AND HOODED RADIATOR FOR WATER RHEOSTAT

[75] Inventor: Kesafumi Matsumoto, Atsugi, Japan

[73] Assignee: Kouken Co., Ltd., Kanagawa, Japan

[21] Appl. No.: 449,672

[22] Filed: Dec. 12, 1989

Related U.S. Application Data

[62] Division of Ser. No. 369,486, Jun. 21, 1989, Pat. No. 4,939,500.

[30] Foreign Application Priority Data

Jul. 11, 1988 [JP] Japan ................................. 63-171021
Aug. 22, 1988 [JP] Japan ................................. 63-206454

[51] Int. Cl.$^5$ .............................................. F28C 3/08
[52] U.S. Cl. .................................. 165/104.33; 62/310; 62/314; 261/152; 261/156
[58] Field of Search ................ 165/104.33; 123/41.01, 123/41.49; 62/310, 314; 261/DIG. 11, 152, 153

[56] References Cited

U.S. PATENT DOCUMENTS

| | | | |
|---|---|---|---|
| 1,691,598 | 11/1928 | Zbinden | 123/41.49 |
| 2,099,667 | 11/1937 | Howse et al. | 62/314 |
| 2,481,135 | 9/1949 | Maness, Jr. et al. | 123/41.01 |
| 3,785,626 | 1/1974 | Bradley et al. | 62/310 |
| 4,488,518 | 12/1984 | Wohlfarth | 123/41.49 |
| 4,853,621 | 8/1989 | Matsumoto | 324/158 R |
| 4,910,457 | 3/1990 | Matsumoto | 324/158 R |

*Primary Examiner*—Albert W. Davis, Jr.
*Attorney, Agent, or Firm*—Jordan and Hamburg

[57] ABSTRACT

An electrode water circulation pump and a plurality of air and water cooling radiators are provided in an electrode water cooling and circulation passage line which is for feeding and draining a prescribed quantity of electrode water so that the temperature and amount of the electrode water in the water rheostat are kept constant. A spray nozzle unit and a motor coupled with a fan are provided in the face of the rear of the body of each of the radiators so that the motor is located behind the spray nozzle unit. The front of the body of each of the radiators is covered with a hood having a steam release port in the top of the hood.

3 Claims, 6 Drawing Sheets

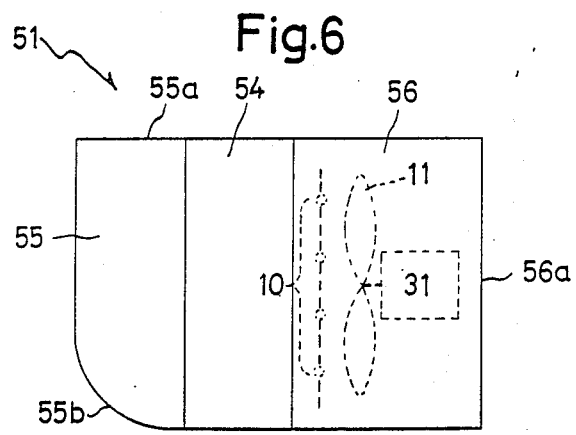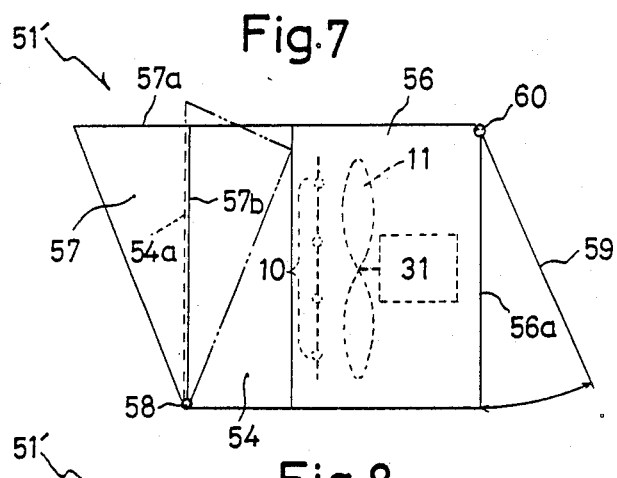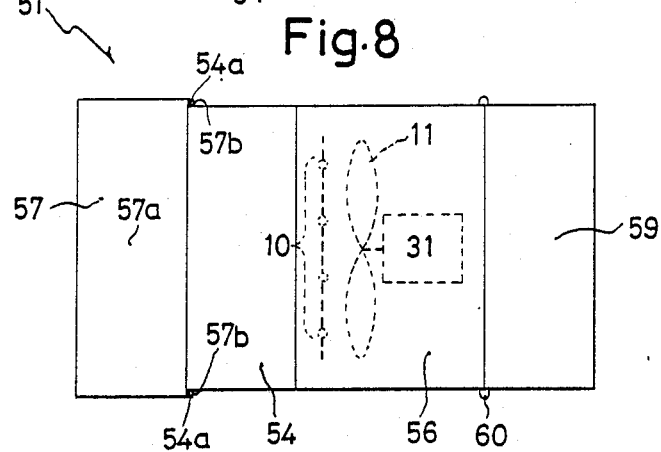

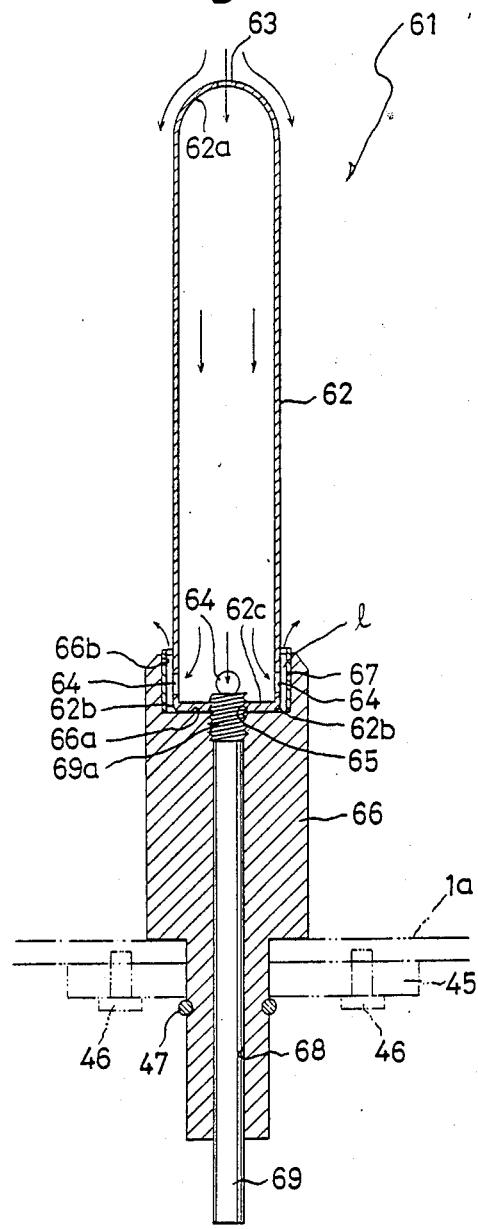

ELECTRODE WATER CIRCULATION AND PROCESSING SYSTEM AND HOODED RADIATOR FOR WATER RHEOSTAT

This is a division of application Ser. No. 369,486, filed June 21, 1989 now U.S. Pat. No. 4,939,500 granted July 3, 1990.

BACKGROUND OF THE INVENTION

The present invention relates to an electrode water circulation and processing system and a hooded radiator for a water rheostat for measuring or testing the output characteristics of a power supply such as an electricity generator and an inverter.

As shown in FIG. 1, a conventional water rheostat A created by the present inventor comprises a base electrode 1 shaped as a bottomed cylinder and containing a prescribed amount of electrode water W which is circulated through the electrode, a main electrode 5 shaped as a cylinder and vertically extending through an electrically insulating support 3 vertically extending through the center of the bottom 1a of the base electrode 1, and an electrically insulating cylinder 7 covering the main electrode and vertically slidable to adjust the length of the uncovered portion of the main electrode 5. A water drain hole 2 is provided in an appropriate portion of the bottom 1a of the base electrode 1. A power cable 4 for a power supply not shown in FIG. 1 is connected to the lower end of the main electrode 5, which is located outside the electrically insulating support 3. A water feed port 6 is provided in the upper portion of the electrically insulating cylinder 7 so that the cooled water W is fed through the port 6.

A plurality of such water rheostats A are provided though not all of them are shown in FIG. 1, so that the main electrodes 5 of the rheostats A are connected to the single or three phases of the power supply, and the base electrodes 1 of the rheostats A are connected to each other through a earth cable 8 and grounded. If the number of the phases of the power supply is three, the water rheostats A are Y-connected to each other. The water feed port 6 and the water drain hole 2 in each of the rheostats A communicate with an electrode water cooling and processing unit B shown in FIG. 1 and disclosed in the Japanese Patent Laid-open Nos. 123287/1987 and 124474/1987.

The electrode water cooling and processing unit B functions so that the warmed water W drained from the water rheostat A is cooled and sent again to the rheostat A. The unit B comprises a radiator 9, a spray pipe 10 for spraying water to the rear of the radiator 9, a fan 11 for blowing air from behind the spray pipe 10, a duct 12 by which the air blown to the radiator 9 by the fan 11 and flowing to the front of the radiator 9 is guided so that the air is dispersed upward, a recovered water tank 13 provided under the radiator 9 to recover the water sprayed from the spray pipe 10 to the radiator 9 and falling therefrom, and a storage tank 14 storing the electrode water W which is circulated through the water rheostat A and the radiator 9.

The cooling and processing unit B has a pure water filling passage line 20, an electrode water cooling and circulation passage line 22, a flushing return passage line 24, and a sprayed water feed passage line 27 among the radiator 9, the spray pipe 10, the recovered water tank 13 and the storage tank 14. The pure water filling passage line 20 functions so that the electrode water W in the storage tank 14 is pumped up by a pure water pump 16 through a water feed pipe 15 extending down into the storage tank 14 and is processed through filters 17 and 18 and a water purifier 19 which heightens the purity of the water. The electrode water cooling and circulation passage line 22 functions so that the electrode water W is received from the pure water filing passage line 20 to the feed portion 22a of the electrode water cooling and circulation passage line 22 and fed to the water rheostat A, and the warmed water drained from the rheostat A is sent to the lower inlet port 9a of the radiator 9 by an electrode water circulation pump 21 provided in the electrode water cooling and circulation passage line 22. The flushing return passage line 24 functions so that the electrode water W dividedly sent out from the drain portion 22b of the electrode water cooling and circulation passage line 22 upstream to the lower inlet port 9a of the radiator 9 is returned to the pure water filling passage line 20 by the pure water pump 16 while being cooled through a cooling coil 23. The sprayed water feed passage line 27 functions so that the water is pumped up, by a spray pump 25, through one of the water feed pipe 15 and a suction pipe 26 extending down into the recovered water tank 13 and is sent to the spray pipe 10. The cooling and processing unit B includes changeover valves 28, 29 and 30 connected to the passage lines 20, 22, 24 and 27.

A fan motor 31, speed controllers 32, 33 and 34 made of inverters to regulate the speeds of the fan motor 31, the pure water pump 16 and the spray pump 25, and a cooling coil 35 are provided further, as shown in FIG. 1.

Shown at C in FIG. 1 is an automatic control unit for vertically moving the electrically insulating cylinder 7. The automatic control unit C comprises a measuring instrument 36 which measures at least one of the electric power and electrical current supplied through the power cable 4 and sends out a measured value signal S1 corresponding to the electric power or the electrical current, a controller 37 which receives the signal S1 and sends out a control signal S2 resulting from the comparison of the signal S1 with a preset value, and an operating unit 38 which recieves the control signal S2 to move up the electrically insulating cylinder 7.

The water rheostats A, the electrode water cooling and processing unit B, the automatic control unit C and so forth can be installed on the cargo bed of an autotruck or the like so as to be rapidly conveyed. The storage tank 14 may be substituted by a pool.

The operation of the electrode water cooling and processing unit B is described in detail from now on. The purified water is sent to the feed portion 22a of the electrode water cooling and circulation passage line 22 through the water feed pipe 15 and the pure water filling passage line 20 and filled into the water rheostat A through the water feed port 6, as shown by full-line arrows in FIG. 1. At that time, the water is pumped up from the storage tank 14 by the pure water pump 16 so that the water flows through the pump 16 and the cooling coil 35 and is removed of sand and the like by the filter 17 and of chlorine by the filter 18 before the water enters into the water purifier 19. Although the electric conductivity of the water entering into the water purifier 19 is about 200 $\mu$s/cm, the conductivity is decreased to about 1 $\mu$s/cm by the purifier 19. If the electric conductivity of the water rises due to the dissolution of an impurity into the water as a result of the initial rotation of the electrode water pump 21, the water is drained and then subjected to the above-described processing and filling again. Since the maximum operating temperature of the water purifier 19 is 40° C., the cooling coils 23 and 35 are used to keep the temperature of the water not higher than 40° C. After the pure water filling passage line 20 is closed by the changeover valves 29 and 30, the electrode water circulation pump 21 is put into action so that the electrode water W is circulated through the electrode water cooling and circulation passage line 22, as shown by dotted-line arrows in FIG. 1. At the same time, the spray pump 25 is put into action so that the water in the storage tank 14 is pumped up through the water feed pipe 15 and fed to the spray pipe 10 through the sprayed water feed passage line 27 as shown by dotted-line arrows in FIG. 1, and is then sprayed from the spray pipe 10 to the radiator 9 as shown by dotted lines in FIG. 1. The fan motor 31 is also put into action to rotate the fan 11 to blow the air from behind the radiator 9, As the electrode water W flows through the water rheostat A, the water acts as an electric resistor so that it consumes electric power and is warmed thereby. The warmed water W is sent to the radiator 9 so that the water is cooled by the sprayed water while the warmed water flows through the radiator 9. The sprayed water is evaporated on the surface of the radiator 9 by the heat of the warmed water W flowing through the radiator, and is then sent out by the air blown from behind the radiator 9 by the fan 11, so that the evaporated water and the air are diffused upward along the guide plates 12a of the duct 12 in front of the radiator 9 as shown by dotted lines in FIG. 1. The electrode water W thus cooled by the radiator 9 flows out therefrom through the outlet port 9b thereof and is then fed again to the water rheostat A through the feed portion 22a of the electrode water cooling and circulation passage line 22. Some sprayed water, which is sprayed to the radiator 9 to cool the warmed water W therein but is not evaporated by the heat thereof, clings to the duct 12 and gravitationally falls therefrom so that the fallen water is recovered into the recovered water tank 13. When the water in the tank 13 has risen to the vicinity of the maximum level, the changeover valve 28 is switched so that the water is pumped up by the spray pump 25 through the suction pipe 26 and sent to the spray pipe 10. The recovered water tank 13 and the storage tank 14 may be connected to each other so as to dispense with the changeover valve 28 and the suction pipe 26.

If the electric conductivity of the electrode water W is to be decreased during the operation of the water rheostat A under a high voltage, the changeover valves 29 and 30 are switched so that the water shown by two-dot chain line arrows in FIG. 1 is circulated through the flushing return passage line 24, the pure water filling passage line 20 and the electrode water cooling and circulation passage line 22. At that time, the electrode water W is drained from the water rheostat A by the electrode water circulation pump 21, sent to the cooling coil 35 through the other cooling coil 23 by the pure water pump 16 and returned to the water rheostat A through the filters 17 and 18 and the water purifier 19, so that the water is removed of extraneous substances, chlorine and so forth, thus decreasing the electric conductivity of the water.

If the water rheostat A is to be put in operation at a heavy electrical current under a low voltage, a salt for electric conduction is dissolved in the electrode water W to make the electric conductivity thereof higher than that, 200 μs/cm, of ordinary tape water, and the electrode water W is circulated through the rheostat A and the electrode water cooling and circulation passage line 22.

An electrode water temperature control unit D comprises a temperature measuring instrument 39, a temperature comparator 40, the speed controllers 32 and 34, the operating unit 38, an alarm 41, and a safety circuit breaker 42. The temperature measuring instrument 39 is provided at the lower inlet port 9a of the radiator 9 connected to the end of the drain portion 22b of the electrode water cooling and circulation passage line 22, and measures the temperature of the electrode water W flowing through the lower inlet port 9a, so that the instrument 39 sends out a measured values signal S3. The temperature comparator 40 receives the measured value signal S3, and sends out a control signal S4 resulting from the comparison of the measured value signal S3 with a preset value. If the control signal S4 has exceeded a preset allowable maximum temperature value, the comparator 40 sends out an emergency signal S5. The speed controllers 32 and 34 are made of the inverters to receive the control signal S4 to regulate the driving of the motor of the spray pump 25 and that of the motor 31 of the fan 11. When operating unit 38 has received the emergency signal S5, the unit 38 disengages a clutch not shown in FIG. 1. When the alarm 41 has received the emergency signal S5, the alarm makes a warning sound. At that time, the safety circuit breaker 42 provided in the half-way portion of the power cable 4 disconnects the power supply and the water rheostat A from each other.

The automatic control unit C and the electrode water temperature control unit D are included in a conventional electrode water circulation and processing system X for the water rheostat A so as to take safety measures against abnormalities.

If the electrode water circulation pump 21 has stopped or the driving capacity thereof has sharply fallen during the operation of the water rheostat A so that the flow rate of the electrode water W from the pump 21 has drastically decreased, the circulated quantity of the water becomes zero or reduced to result in a sharp rise in the temperature of the water in the base electrode 1 to boil the water into overflowing. This phenomenon is very dangerous. Since there is a lag time until the temperature measuring instrument 39 detects the sharp rise in the temperature of the electrode water W, arc discharge $a$ occurs between the base electrode 1 and the main electrode 5 during the lag time. Until a short-circuit overcurrent due to the arc discharge is detected by the measuring instrument 36, the electrically insulating cylinder 7 is not moved down to completely cover the main electrode 5 to insulate it. For these reasons, moving down the cylinder 7 to insulate the main electrode 5 is likely to be too late to avoid a danger resulting from the occurrence of the arc $a$.

Let us suppose now that vertical electrode plates P1 and P2 face each other in parallel in a fixed amount of water L in the water rheostat A', as shown in FIG. 2. When a voltage E applied to the electrode plates P1 and P2 is increased to a certain value, discharge takes place between them. If the electrode plates P1 and P2 were infinitely-extensive flat plates parallel with each other, the discharge would be most unlikely to take place between them. However, such infinitely-extensive flat plates do not exist in reality. The potential V on the surface of the electrode plate is expressed as follows:

$$V = K\frac{Q}{r}$$

In the equation, K, Q and r denote a coefficient, the amount of electric charge and the radius of curvature of the electrode plate, respectively. Since the electrode plate is flat, the radius r of curvature is infinitely large. However, the potential V on the corner $\theta$ of the electrode plate is equal to that in the case of $r \approx 0$. The potential V in the case of $r \approx 0$ is infinitely high as understood from the above equation. Therefore, the discharge is most likely to take place on the corner of the electrode plate. The corner of each of the electrode plates can be eliminated by shaping the plate as a sphere or a cylinder. For such purpose, the main electrode 5 is composed of an upper and a lower hemispherical end portions 5a and 5b and an intermediate cylindrical portion 5c, as shown in FIG. 3. Since the radius of curvature of the base electrode 1 shaped as a bottomed cylinder and located outside the main electrode 5 is larger than that of the main electrode 5, the potential on the base electrode 1 is lower than that on the main electrode 5.

The discharge in the water W between the main electrode 5 and the base electrode 1 in the water rheostat A takes place due to a bubble generated by the local heating of the surface of the main electrode 5. When the bubble is generated between the electrodes 1 and 5, the area of the substantial mutual facing of the electrodes fluctuates. Since the movement of the bubble is irregular, the electric resistance between the electrodes 1 and 5 irregularly changes so that dielectric breakdown occurs. The only means for preventing and removing the bubble is cooling and cleaning the surface of the main electrode 5 with an uniform rapid flow of water.

A conventional water rheostat of such kind was invented by the present inventor and disclosed in Japanese patent application no. 251652/1987. After that, the form and constitution of the main electrode unit 43 of the water rheostat A was modified as shown in FIG. 4. FIG. 4 shows an electrically insulating support 3, a main electrode 5 on the support 3, an electrode connection rod 44, the bottom 1a of a base electrode 1 shaped as a bottomed cylinder, a fixed block 45 secured to the bottom 1a of a base electrode 1 by screws 46, and an annular seal 47 for preventing electrode water from leaking. The bottom 5a of the main electrode 5 is made flat in order to stably support the electrode 5 on the support 3. The bottom 5a is provided with a curved chamfer 5b at the periphery of the bottom 5a. Since the radius of curvature of the curved chamfer 5b is so small that when the temperature of the electrode water has risen to 65° C., a bubble is generated on the curved chamfer 5b and arc discharge takes place at the bubble. For that reason, the maximum electric power applicable to the electrodes 1 and 5 is 650 kw. Because of the arc discharge, the electric power output across the electrodes 1 and 5 is likely to fluctuate so as to hinder proper measurement in a load test, reduce mechanical capacity and cause a burnout accident.

Since the conventional electrode water circulation and processing system X has only the radiator 9, the spray pipe 10, the fan 11 and the duct 2 for cooling the electrode water W, the cooling capacity of the system X is relatively low. However, if the radiator 9 is made larger in size to increase the cooling capacity of the system X, the radiator 9 occupies a larger space and the cost of equipment and running of the system X are augmented. For that reason, the output characteristics of the power supply cannot be measured at a heavy current under a high voltage with the use of the system X.

SUMMARY OF THE INVENTION

The present invention was made in order to solve the abovementioned problems of the conventional electrode water circulation and processing system and increase the capacity thereof.

Accordingly, it is an object of the present invention to provide an electrode water circulation and processing system and a hooded radiator.

It is another object of the present invention to provide an electrode water circulation and processing system for a water rheostat having a main electrode whose form and constitution are such that arc discharge is less likely to occur on the main electrode.

The water rheostat has a main electrode unit including the main electrode shaped as a hollow cylinder and provided with an electrode water inlet port in the top of the hemispherical upper portion of the electrode, electrode water outlet ports at equal intervals at the bottom of the electrode along the total circumference of the electrode and a tapped hole in the bottom of the electrode. A sleeve resistant to arc discharge is fitted in the circular recess of the top portion of electrically insulating support of the main electrode unit so that the sleeve is in contact with the inside circumferential surface of the top portion. The support is fitted in the center of the bottom of a base electrode so that the support extends through the center. The electrode connection rod of the main electrode unit extends through the axial hole of the electrically insulating support. The threaded portion of the electrode connection rod, which projects from the upper end of the axial hole of the support, is engaged in the tapped hole of the bottom of the main electrode, which is inserted in the circular recess of the support so that a circumferential gap is defined between the bottom of the main electrode and the inside circumferential surface of the top portion of the support. An electrode water circulation pump and a plurality of air and water cooling radiators are provided in an electrode water cooling and circulation passage line which is for feeding and draining a prescribed quantity of electrode water so that the temperature and amount of the electrode water in the water rheostat are kept constant. A flow meter is provided in the drain portion of the electrode water cooling and circulation passage line at the outlet side of the electrode water circulation pump. A safety circuit breaker is provided in the halfway portion of a power cable for connecting the main electrode to a power supply, so that the breaker is turned off when the flow meter has detected that the flow rate of the electrode water in the meter is less than a prescribed value. A spray nozzle unit and a motor coupled with a fan are provided in the face of the rear of the body of each of the radiators so that the motor is located behind the spray nozzle unit. The front of the body of each of the radiators is covered with a hood having a steam release port in the top of the hood.

DESCRIPTION OF THE DRAWINGS

FIG. 6 is a right-hand side view of an air and water cooling radiator which has a hood and is an embodiment of the present invention;

FIG. 7 is a right-hand side view of an air and water cooling radiator which has a hood and is an embodiment of the present invention;

FIG. 8 is a plan view of the air and water cooling radiator shown in FIG. 7; and FIG. 9 is a longitudinally sectional view of a main electrode which is an embodiment of the present invention.

DETAILED DESCRIPTION OF EXEMPLARY EMBODIMENTS

Figure 1:
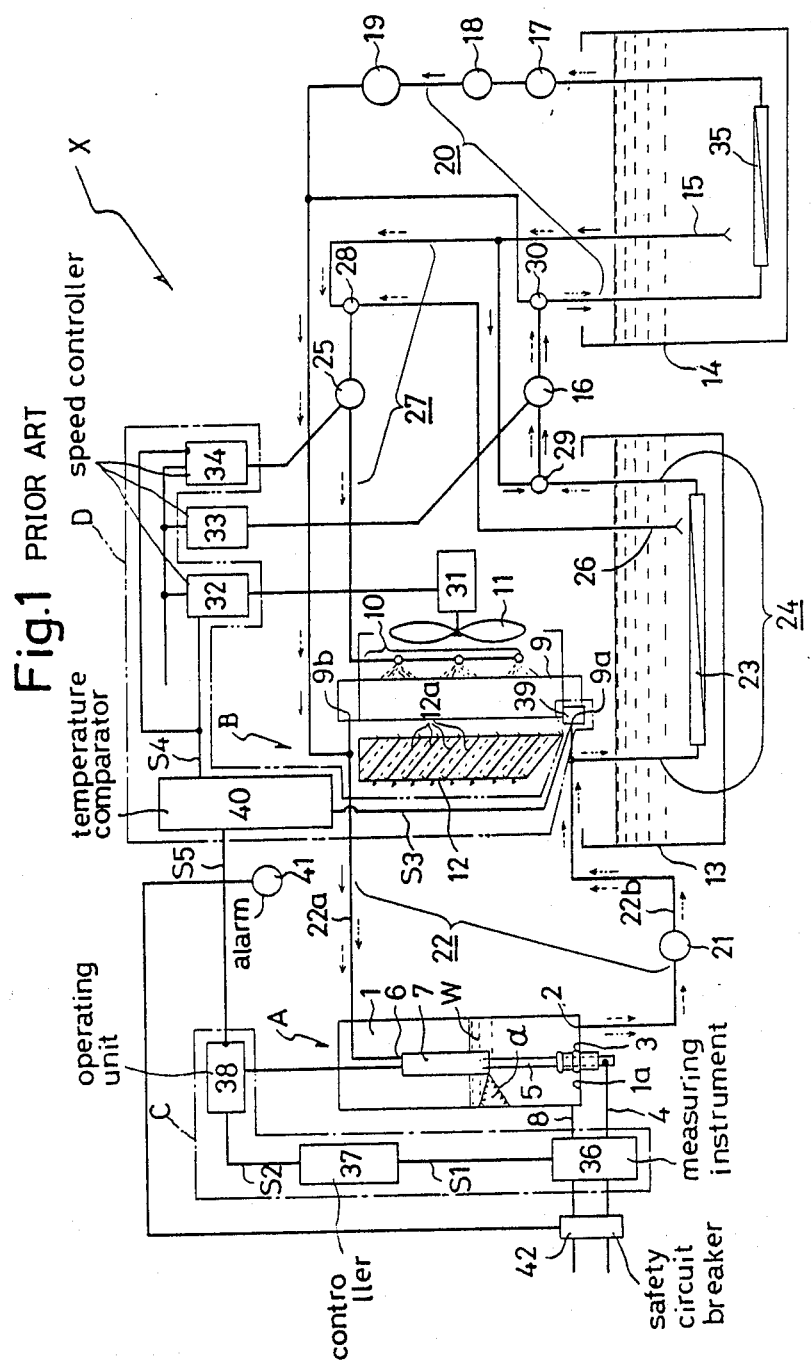
FIG. 1 is a diagram of the piping and wiring of a conventional electrode water circulation and processing system for a water rheostat.
Figure 2:
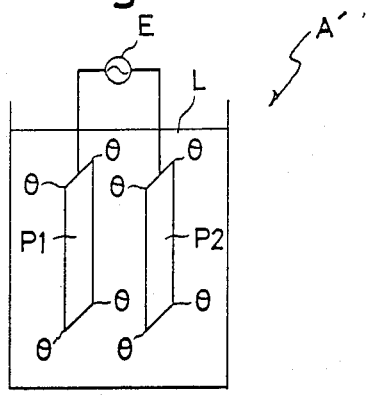
FIG. 2 is a view for describing the relationship between discharge and electrode plates.
Figure 3:
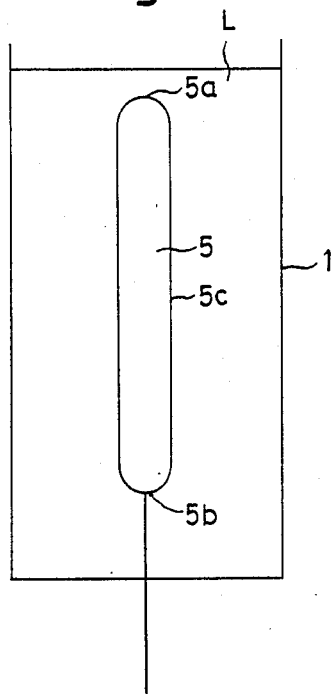
FIG. 3 is a view for describing the ideal form of a main electrode.
Figure 4:
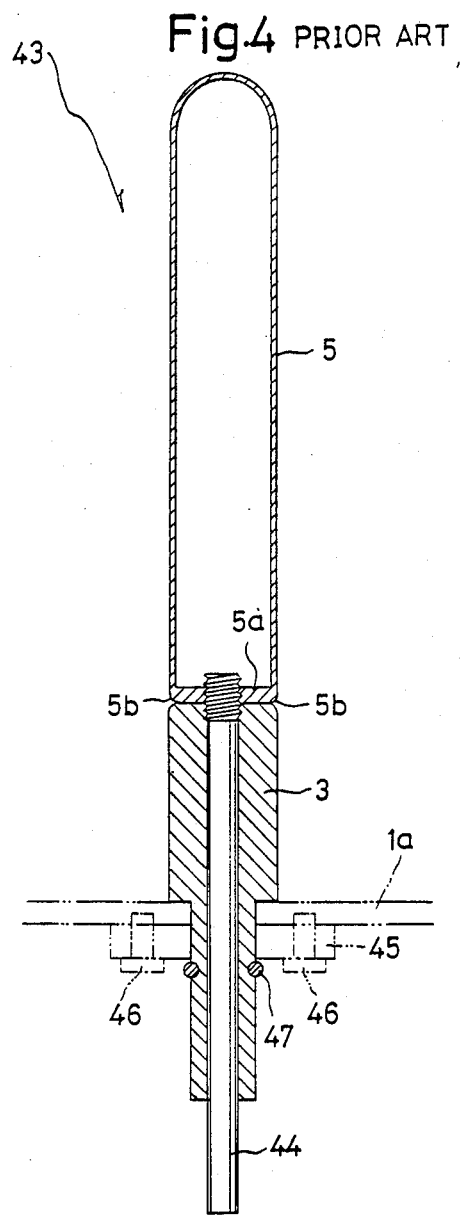
FIG. 4 is a longitudinally sectional view of a conventional main electrode.

Embodiments of the present invention are hereafter described in detail with reference to the drawings attached hereto. The mutually equivalent portions shown in the drawings are denoted by the same reference symbols therein.

Figure 5:
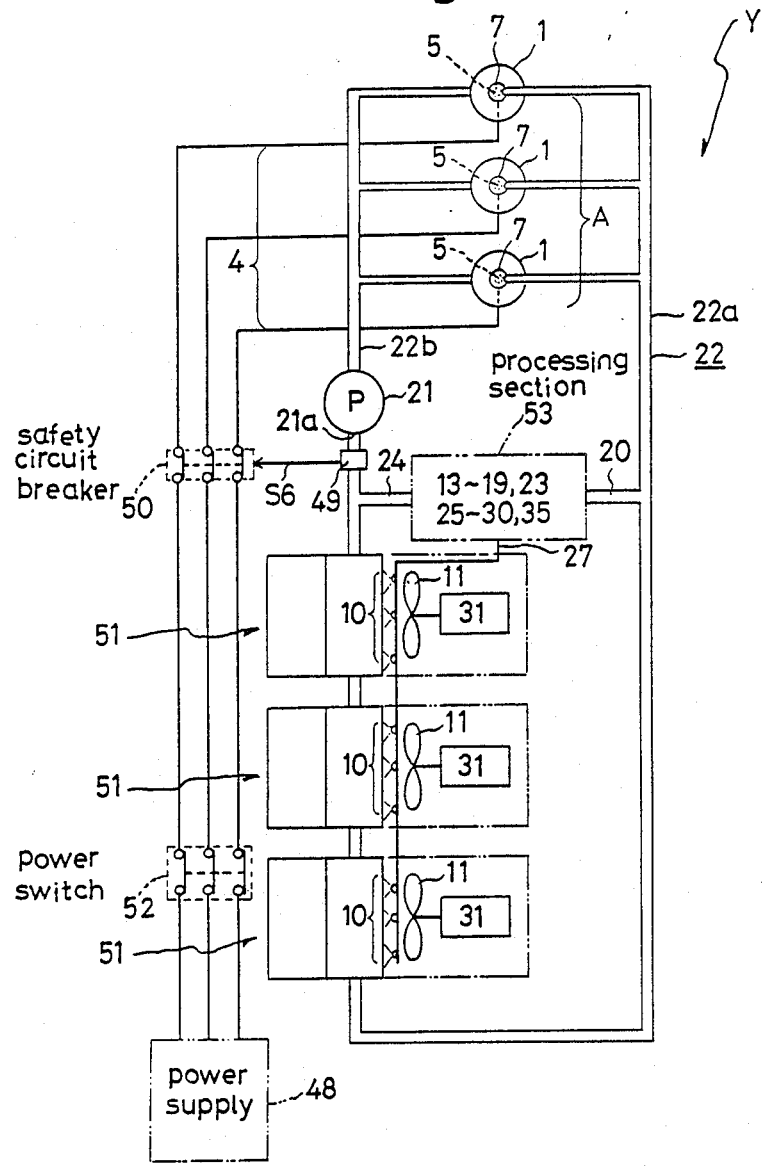
FIG. 5 is a diagram of the piping and wiring of an electrode water circulation and processing system which is an embodiment of the present invention and is for a water rheostat.

FIG. 5 shows an electrode water circulation and processing system Y which is one of the embodiments and is for a water rheostat A. A power supply 48 shown in FIG. 5 is a three-phase power supply. In the system Y, a flow meter 49, which is of the flow switch type and is normally used at the pressure of 1 kg/cm$^2$, is provided in the drain protion 22b of an electrode water cooling and circulation passage line 22 near the outlet port 21a of an electrode water circulation pump 21. A safety circuit breaker 50 is provided in the halfway portions of three-phase power cables 4. When it is detected by the flow meter 49 that the quantity of electrode water W discharged from the outlet port 21a of the circulation pump 21 has become smaller than a preset value, an electrical current cutoff command signal S6 is generated to quickly turn off the circuit breaker 50 to stop supplying an electrical current from the power supply 48 to the water rheostat A. Three air and water cooling radiators 51 having hoods are provided in the halfway portion of the electrode water cooling and circulaton passage line 22 and connected in series with each other so that the cooling capacity of the system Y for the electrode water W is heightened. Shown at 52 and 53 in FIG. 5 are a power switch and a processing section which includes pipes and appliances 13, 14, 15, 16, 17, 18, 19, 23, 25, 26, 27, 28, 29, 30, and 35 and is connected to the electrode water cooling and circulation passage line 22 through a flushing return passage line 24 and a pure water filling passage line 20. The safety circuit breaker 50 may include the function of the safety circuit breaker 42 shown in FIG. 1.

In each of the radiators 51, the hood 55 having a steam release port 55a in the top of the hood 55 and having a curved bottom 55b, and a cover 56 having an air suction port 56a in the rear of the cover 56 are integrally coupled to the front and rear of the body 54 of the radiator 51 so that the hood 55 and the cover 56 communicate with each other, as shown in FIG. 6. A spray nozzle means 10 and a motor 31 coupled with a fan 11 are provided in the cover 56.

FIGS. 7 and 8 show a radiator 51' which is another of the embodiments. In the radiator 51', a hood 57 having a steam release port 57a in the top of the hood 57 and having sides each shaped as an inverted right-angled triangle is pivotally coupled at the bottom of the hood 57 to the body 54 of the radiator 51' at the bottoms of the front portions of the right and left sides of the body 54 so that the hood 57 can be freely swung. When the radiator 51' is not in use, the hood 57 is swung back so that it is folded as shown by chain lines in FIG. 7. When the radiator 51' is put in use, the hood 57 is swung forth so that the right and left side edges 57b thereof are engaged with edge stoppers 54a projecting from the right and left sides of the body 54 of the radiator 51', as shown by full lines in FIGS. 7 and 8. A door plate 59 capable of closing the air suction port 56a of the cover 56 of the radiator 51' is pivotally coupled with a pivot 60 at the upper edge of the door plate 59 to the edge of the cover 56 over the air suction port 56a so that the door plate 59 extends down and can be freely swung to open and close the port 56a. When the radiator 51' is not in use, the door plate 59 is closed to the air suction port 56a. When the radiator 51' is put in use, the door plate 59 is opened from the air suction port 56a as shown by full lines in FIGS. 7 and 8. When the radiator 51' is not in use, it is folded as described above, to occupy a smaller space and to be tightly closed to prevent rain water or dust from entering into the radiator 51' in the case that the electrode water circulation and processing system Y is installed outdoor or on a vehicle.

As shown in FIG. 9, the main electrode unit 61 of the water rheostat A comprises a main electrode 62 shaped as a hollow cylindrical body, an electrically insulating support 66 made of ceramic, polypropylene or the like and resistant to arc discharge, and an electrode connection rod 69. The main electrode 62 has an electrode water inlet port 63 in the top of the hemispherical upper end portion 62a of the electrode 62. The bottom 62c of the main electrode 62 is provided with a curved chamfer 62b at the periphery of the bottom 62c. A tapped hole 65 extends through the center of the bottom 62c of the main electrode 62. Electrode water outlet ports 64 are provided at equal intervals in the main electrode 62 near the bottom 62c thereof along the total circumference of the electrode 62. A sleeve 67 made of ceramic or the like and resistant to arc discharge is fitted in the circular recess 66a of the top portion of the support 66 so that the sleeve is in contact with the inside circumferential surface 66b of the top portion of the support 66. The support 66 is fitted through in the center of the bottom 1a of the base electrode 1 of the water rheostat A. The electrode connection rod 69 extends through the axial hole 68 of the support 66. The threaded portion 69a of the rod 69, which extends through the upper end of the axial hole 68, is engaged in the tapped hole 65 of the bottom 62c of the main electrode 62 inserted in the circular recess 66a of the support 69 in such a manner that a prescribed circumferential gap 1 is defined between the main electrode 62 and the inside circumferential surface of the sleeve 67. A fixed block 45 is secured to the bottom 1a of the base electrode 1 by screws 46.

An annular seal 47 is fitted on the support 66 to prevent the electrode water W from leaking. When the sleeve 67 is fitted in the circular recess 66a of the top portion of the support 66, the top portion is heated to increase the diameter of the inside circumferential surface 66b thereof and press-fit the sleeve 67 in the recess 66a. After the press-fitting, the top portion of the support 66 is cooled to the room temperature to decrease the diameter of the inside circumferential surface 66b thereof. The sleeve 67 is thus firmly fitted in the recess 66a of the support 66. The sleeve 67 may otherwise be firmly fitted in the recess 66a.

The depth of the recess 66a is such that the electrode water outlet ports 64 are located in the recess 66a.

The bottom 62c of the main electrode 62 and the upper end of the electrode connection rod 69 may be coupled to each other by another means such as inserting the threaded portion 69a of the rod into the through hole of the bottom 62c and tightening a nut on the threaded portion 69a, and welding the bottom 62c to the upper end of the rod 69.

If the flow rate of the electrode water W in the electrode water cooling and circulation passage line 22 has become zero or less than a prescribed value due to the stoppage of the electrode water pump 21, the fall in the capacity thereof or the like during the operation of the electrode water circulation and processing system Y, the flow meter 49 immediately detects such a change in the flow rate of the water W to turn off the safety circuit breaker 50 to quickly cut off the electric power from the power supply 48 to stop the output characteristic measuring test thereof before the temperature of the electrode water W in the base electrode 1 of the water rheostat A rises to boil the water W to let arc discharge occur.

Since the plural radiators 51 having the hoods 55 are provided in the electrode water cooling circulation passage line 22, the electrode water cooling capacity of the system Y is high enough for the system Y to adequately work for the output characteristic measuring test of the power supply 48 at a heavy current under a high voltage.

If the consumption of electric power by the water rheostat A increases by 14.8 kw/° C. for every Celsius degree of the difference between the temperature of the electrode water W in the rheostat A and that of the outside air, the maximum allowable water temperature for a conventional electrode water circulation and processing system X and that for the system Y which is the embodiment are 65° C. and 75° C., respectively, and the temperature of the outside air is 25° C., for instance, the margin in the electrode water cooling capacity of each of the systems X, Y is calculated as follows:

The conventional system: 65° C.−25° C.=40° C.; 40° C.×14.8 kw/° C.=592 kw;

The present system Y: 75° C.−25° C.=50° C.; 50° C.×14.8 kw/° C.=740 kw;

Comparison of the systems: 740 kw−592 kw=148 kw

Therefore, the electrode water cooling capacity of the system Y is higher than that of the conventional system X by 148 kw. In other words, the allowable amount of heat generated by the water rheostat A connected to the power supply 48 is larger as to the system Y than that as to the conventional system X.

As described above, the flow meter 49 is provided immediately downstream to the electrode water circulation pump 21 to take safety measures to prevent the electrode water W in the water rheostat A from boiling and overflowing due to an accident such as the trouble of the pump 21, the fall in the capacity thereof and the clogging of the electrode water cooling and circulation passage line 22 so as to let the arc discharge occur in the rheostat A. Besides, the plural radiators 51 having the hoods 55 are provided in series with each other halfway in the passage line 22 to make the electrode cooling capacity of the electrode water circulation and processing system Y high enough to enable the system Y to work for the output characteristic measuring test of the power supply 48 at a heavy current under a high voltage.

The electrode water W processed to a prescribed temperature and a prescribed electric conductivity by the circulation and processing system Y during the circulation of the water W is dropped onto the top of the main electrode 62 of the main electrode unit 61 of the water rheostat A as shown by arrows in FIG. 9, so that some of the water W enters into the main electrode 62 through the electrode water inlet port 63 of the center of the top thereof, flows down on the inside surface of the electrode 62, and goes out of the electrode 62 into the circumferential gap l through the electrode water outlet ports 64 near the bottom 62c of the electrode 62, as shown by arrows in FIG. 9. The curved chamfer 62b of the bottom 62c of the main electrode 62 is located in the circular recess 66a of the electrically insulating support 66 so that the curved chamfer 62b, on which the arc discharge is most likely to occur, is not exposed to the base electrode 1, and the electrode water W flowing through the electrode water outlet ports 64 and the circumferential gap l constantly cools the bottom 62c to prevent a bubble from being generated due to the local heating of the bottom 62c so as to cause dielectric breakdown resulting in the arc discharge. Even if the arc discharge should occur, the electrically insulating support 66 does not burn because it is protected by the sleeve 67 resistant to arc discharge.

Thus, the inside and outside surfaces of the main electrode 62 are cooled by the flowing electrode water W constantly circulated and cooled by the electrode circulation and cooling system Y, so that the temperature of the electrode 62 is not locally increased. Besides, the bottom of the main electrode 62, on which the arc discharge is most likely to occur, is located deep in the circular recess 66a fitted with the sleeve 67 and is constantly cooled by the electrode water W, so that the arc discharge temperature for the system Y is 75° C. which is by 10° C. higher than that, 65° C., for the conventional system X. As a result, the maximum applicable electric power for the system Y is higher than that for the conventional system X. For that reason, the range of measurability for the output characteristics of the power supply with the use of the system Y is wider than that for them with the use of the conventional system X although the systems X, Y are the same in size. In other words, the capacity of the system Y is higher than that of the conventional system X.

What is claimed is:

1. A hooded radiator comprising a spray nozzle means and a motor coupled with a fan located behind said spray nozzle means, said spray nozzle means and motor coupled fan being provided at the face of the rear of the body of said radiator, said radiator being provided in an electrode water cooling and circulation passage line, and a hood covering the front of said body and having a steam release port in the top of said hood, each of both sides of said hood being shaped as an inverted right-angled triangle and being pivotally coupled at the bottom of said sides to the bottom of both side edges of the front of the body of said radiator so that said hood can be freely swung, both of said sides of said hood being slidably overlaid on both sides of said body.

2. A hooded radiator comprising a spray nozzle means and a motor coupled with a fan located behind said spray nozzle means, said spray nozzle means and said motor coupled fan being provided at the face of the rear of the body of said radiator, said radiator being provided in an electrode water cooling and circulation passage line, and a hood covering the front of said body and having a steam release port in the top of said hood, said spray nozzle means and said motor coupled fan being provided in a cover, one end of said cover being open, said cover being disposed in contact with the entire rear of the body of said radiator, and a door plate pivotally coupled at the top of said cover at said open end of said cover so that said door plate extends downwardly and can be freely swung to opened and closed positions.

3. A hooded radiator apparatus for a water rheostat provided in an electrode water cooling and circulation passage line, comprising a radiator having a radiator body, said radiator body having a front and a rear, a spray nozzle means and a motor driven fan disposed at said rear of said radiator body, a hood means joined to said radiator body and extending about said front of said radiator body to prevent scattering of water which has been sprayed by said spray nozzle means, said hood means having a top portion and a bottom portion, said top portion having a steam release port for releasing steam from said hood means, said bottom portions being curved so as to recover water sprayed by said spray nozzle means such that said recovered water passes along said curved bottom portion to pass into an underlying recovery tank.

* * * * *